United States Patent [19]

Hsu et al.

[11] Patent Number: 5,451,529
[45] Date of Patent: Sep. 19, 1995

[54] METHOD OF MAKING A REAL TIME ION IMPLANTATION METAL SILICIDE MONITOR

[75] Inventors: Shun-Liang Hsu, Hsin-Chu; Chun-Yi Shih, Hsinchu, both of Taiwan

[73] Assignee: Taiwan Semiconductor Manufacturing Company, Hsinchu,

[21] Appl. No.: 270,764

[22] Filed: Jul. 5, 1994

[51] Int. Cl.⁶ ................... H01L 21/00; H01L 21/66
[52] U.S. Cl. ........................... 437/8; 437/7; 148/DIG. 83; 148/DIG. 162
[58] Field of Search ............ 148/DIG. 82, DIG. 162, 148/DIG. 83; 437/7, 8

[56] References Cited

U.S. PATENT DOCUMENTS

| | | | |
|---|---|---|---|
| 3,676,229 | 6/1972 | Einthoven et al. | 437/8 |
| 4,257,825 | 3/1981 | Schaumburg | 437/7 |
| 5,082,792 | 1/1992 | Pasch et al. | 437/7 |
| 5,179,433 | 1/1993 | Misawa et al. | |
| 5,185,273 | 2/1993 | Jasper | 437/8 |
| 5,217,907 | 6/1993 | Bulucea et al. | 437/8 |
| 5,260,599 | 11/1993 | Ponse et al. | |
| 5,347,226 | 9/1994 | Bachmann et al. | 437/8 |

FOREIGN PATENT DOCUMENTS 60-00447 6/1985 Japan.
1-136331 5/1989 Japan.
4-305921 10/1992 Japan.

OTHER PUBLICATIONS

S. Wolf & R. N. Tauber "Silicon Processing for the VLSI era" vol. I, 1986 pp. 280–283.
H. Glawischnig et al., "Summary of the 4th Int. Conf. on Ion Implantation", IEEE Trans. Nuclear Dev., NS-30, #2, (83) 1693.
S. Aronowitz et al., J. Electrochem. Soc. (Solid St. Sci & Tech.) Dec. 1983, p. 2502 "Sheet Resistance and Junction Depth Relat. in Implanted Species Diffusion".

*Primary Examiner*—Brian E. Hearn
*Assistant Examiner*—Leon Radomsky
*Attorney, Agent, or Firm*—George O. Saile

[57] ABSTRACT

A novel technique for the real time monitoring of ion implant doses has been invented. This is the first real-time monitor to cover the high dosage range (10E13 to 10E16 ions/sq. cm.). The underlying principle of this new technique is the increase in the resistance of a metal silicide film after ion implantation. Measurement of this increase in a silicide film that has been included in a standard production wafer provides an index for correlation with the implanted ion dose.

31 Claims, 5 Drawing Sheets

METHOD OF MAKING A REAL TIME ION IMPLANTATION METAL SILICIDE MONITOR

BACKGROUND OF THE INVENTION

1. Field of the Invention

The present invention relates to a method for measuring implanted ion dosages in semiconductors, both in real time as well as off-line. A particular feature of the method is its quick turnaround time and the wide range of implanted ion dosages that it can handle.

2. Description of the Prior Art

Ion implant technology is widely used in the fabrication of integrated circuits. It is standard in the art to sample the incoming ion current during deposition, integrating said current so as to obtain a measure of total dosage. It is, however, also necessary to obtain a direct measurement of the amount of material that was actually deposited. The two principal methods currently in use for this are (a) Thermal Wave and (b) Implanted Si Wafer.

The Thermal Wave employs a film of SiO2 as the monitoring medium for the implanted ions. While it has a cycle time of about a ½ hour, this method is limited to measuring ion concentrations in the range of $1 \times 10E11$ to $1 \times 10E13$/sq. cm. It cannot be used for sheet densities higher than this because the structure tends to self anneal (and thus invalidate the subsequent measurement) at the higher ion fluxes that are needed to reach these higher densities.

The Implanted Si Wafer is based on the measurement of electrical sheet resistance in the silicon itself. The method works best in the range of $1 \times 10E13$ to $1 \times 10E16$/sq. cm., however it involves a number of steps after ion implantation, such as heat treatment, oxide removal, etc. resulting in a cycle time that is in excess of half a day. In U.S. Pat. 5,217,907, May 1995, Bulucea et al. describe a probe for measuring sheet resistance, but the method is general and not related to ion implanted material as such.

Jasper, in U.S. Pat. No. 5,185,275, Feb. 1995, describes a method for measuring ion implantation dosages in gallium arsenide by using a silicon wafer as a monitor and then relating measurements made on the silicon to ion dosages in the gallium arsenide. This method suffers from the same disadvantages as other silicon based ion implant monitors as has already been discussed above.

SUMMARY OF THE INVENTION

An object of the invention is to provide a method for monitoring ion implant dosage into a semiconductor. A metal layer having a known sheet resistance is deposited adjacent to, or on, the semiconductor. When a dopant is simultaneously ion implanted into both the semiconductor and the metal layer, the latter is damaged by the ion implanting process. This results in a change of sheet resistance. This resistance change can then be related to the implanted ion dosage in the semiconductor.

DESCRIPTION OF THE PREFERRED EMBODIMENTS

Now in keeping with the objects of the invention, the method for monitoring ion implantation, either real time or off line, is covered in detail.

When donor or acceptor ions are implanted in a semiconductor by means of ion bombardment, the electrical resistivity of the semiconductor gets modified in two ways. Ions that find their way to vacancies in the crystal lattice become electrically active, increasing the number of carriers and thus lowering the resistivity. Implanted ions, in general, cause damage to the crystal lattice which reduces the mobility of the carriers, thus raising the resistivity.

Heat treatment after the implantation of ions in a semiconductor allows additional ions to become electrically active and at the same time repairs much of the lattice damage that occurred as a result of the ion bombardment. Thus, electrical resistivity cannot be used as a measure of implanted ion concentration in a semiconductor until it has been subjected to one or more time consuming heat treatments.

In a metal or alloy, however, only the lattice damage mechanism plays a role in the effect of ion bombardment on resistivity. Thus, for such a material, the change in electrical resistivity immediately after ion bombardment is a reliable measure of the concentration of the ions that have been implanted in it. Furthermore, as already discussed, heat generated as a byproduct of the ion bombardment process can result in premature heat treatment (self anneal), which limits the useful range of the implanted Si wafer method, for example. When a metal is used in place of a semiconductor for the implant dosage monitor there now becomes available a much wider range of materials from which to choose, refractory metals or alloys being the preferred choice since the effects of self anneal diminish as the melting point of the material being bombarded is raised.

A group of materials that meet the criteria of metallic conduction and high melting point are the refractory metal silicides such as tungsten silicide, titanium silicide, and cobalt sill tide. An additional advantage of this family of materials is that they are relatively easy to deposit as thin films. Tungsten silicide is first choice for a preferred embodiment of the invention since it is the most refractory of the three, but the invention will work for any of these materials.

Figure 1:
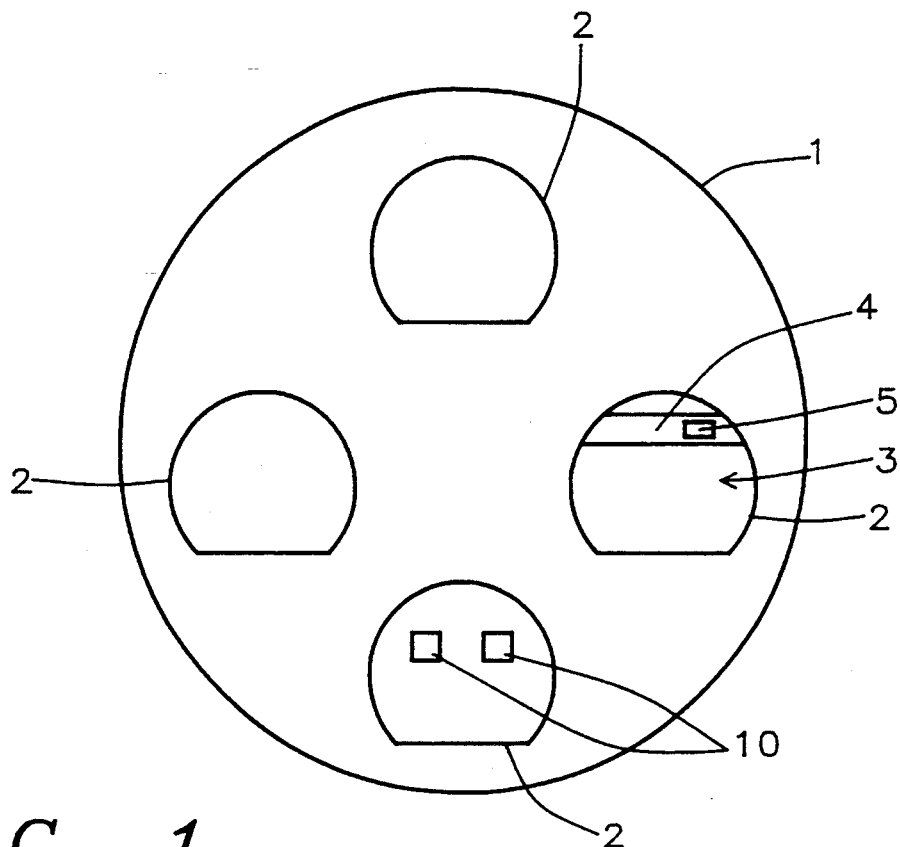
FIG. 1 shows a table holding several semiconductor wafers during ion implantation.

Referring now to FIG. 1, we show a suitable table I whose purpose is to support several semiconductor wafers 2 (four in this example, but many more than this in practice) during ion implantation. Adjacent to the semiconductor wafers is a suitable control wafer 5 which has the ion implant monitor. In accordance with standard practice, each of the wafers has an area 4 that is reserved for post and in process testing. As one embodiment of this invention, an area 5 within the test area is reserved for the ion implant monitor.

Figure 2A:
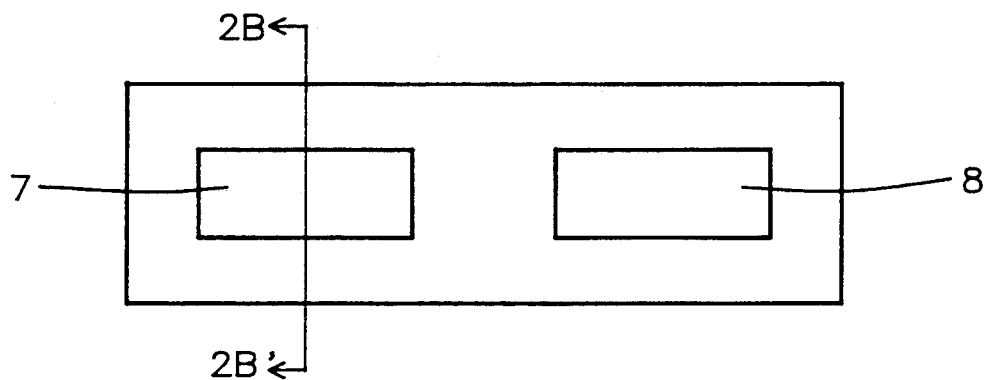
FIGS. 2A and 2B illustrate more detailed views of one embodiment of the ion implant monitor.
Figure 2B:
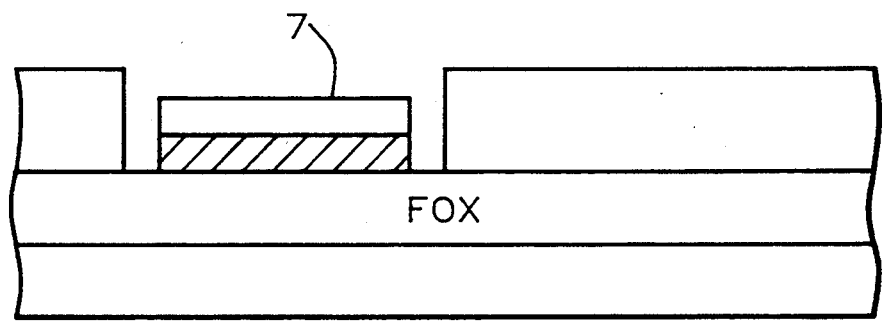

FIG. 2A shows a more detailed view of area 5. It has been subdivided into two separate areas of which one, area 7, is reserved for monitoring the ion implant of P type dopants while the other, area 8, is reserved for the monitoring of N type dopants. FIG. 2B is a cross-section taken through area 7.

The first step in the practice of the invention is to lay down a film of tungsten silicide in regions 7 and 8 in FIG. 2A. Preferably for all of area 5, but definitely for the areas 7 and 8, the layer immediately underlying the film must be electrically insulating. The preferred metal film thickness is in the range of between 2,500 Angstrom Units to 1,000 Angstroms. The practice of the invention does not require any particular method for the deposition of the film although we have found it is preferred to use chemical vapor deposition (CVD).

Following the deposition and annealing of the tungsten silicide film the sheet resistance in the two areas marked 7 and 8 in FIG. 2A are measured using a standard technique such as a four-point probe. Following this, processing of the integrated circuits can proceed as normal except that steps must be taken to prevent areas 7 and 8 from receiving any deposited material except at the appropriate times. The appropriate times in this instance are when ion implantation is taking place. A typical sequence for the ion implantation steps might be as follows:

| implant type | area left 'uncovered' | |
| --- | --- | --- |
| N− | (8) | |
| P− | (7) | [During other processing steps monitor is covered] |
| N+ | (8) | |
| P+ | (7) | |

After each ion implantation step the implanted ion concentration is derived from the increase in sheet resistance of the 'uncovered' area by means of previously prepared calibration curves. Examples of such curves are shown in FIGS. 4 through 10.

Figures 3A, 3B:
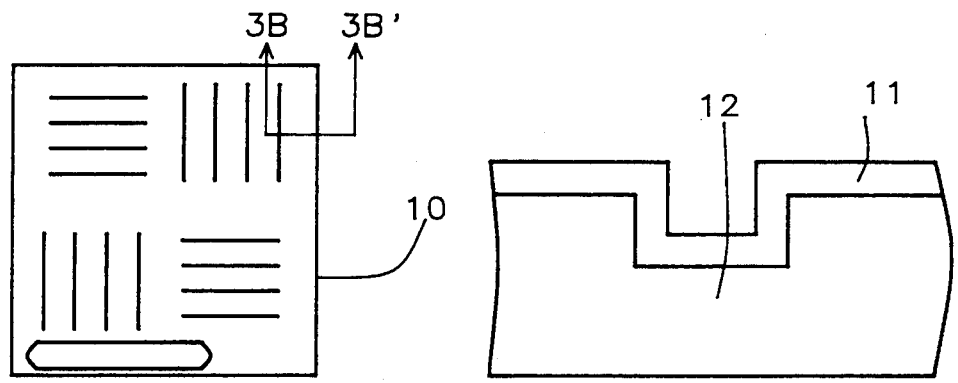
FIGS. 3A and 3B illustrate a second embodiment of the ion implant monitor.

A second embodiment for the monitor involves using alignment marks of the wafer 2 as indicated at 10. FIG. 3A shows a more detailed view of the alignment area 10 while FIG. 3B shows a cross-section taken through one of the alignment marks. A layer of metal silicide 11 is shown coating the silicon 12 in which an alignment mark has been made. In general, alignment marks are protected by a layer of photoresist throughout the manufacturing process except when they are being used for alignment purposes. In this embodiment, two of the alignment marks are coated with metal silicide for use as monitors and then are protected with photo-resist as before, except during the ion implantation steps that they will be monitoring. One of the alignment marks is used to monitor the N− and N+ implants, the other to monitor the P− and P+ implants.

A third embodiment for the monitor involves using the scribe lines that are present on the wafer for the purpose of delineating the individual chips. Until the wafer is diced into individual chips, the scribe lines have no other purpose so are available for use as a monitoring area.

The following examples show experimental results of testing the inventions and also describe how the aforementioned calibration curves were prepared. These results should not be considered as limiting our invention:

Films of 1500 or 2000 Angstroms of tungsten silicide having a chemical composition WSix (x=2.7) were deposited on the <100> P type 8–12 ohm cm. bare silicon wafers by Low Pressure Chemical Vapor Deposition (LPCVD) using the GENUS 8710 system at 360 deg. C. and 200 mTorr. The sheet resistances were 45 and 37 ohms/square for the as-deposited WSix 1500 and 2000 Angstroms, respectively. The samples were then annealed at 900 or 920 deg. C. in a N2 ambient for 10 minutes before O2 oxidation for 30 minutes. After the removal of the oxide layers using 50:1 BOE for 5 minutes, the resistances of the WSix films were measured by a four-point probe. Subsequently, dopants were implanted into the silicide with a flux of $5\times10E11$ to $5\times10E15$ ions/sq. cm. determined by sampling the incoming ion current for As+, P+, B+, and BF2+. Two or three different implant energies were used for each ion in the experiment. Following the implantation, the resistance of the WSix was measured by a four-point probe. The microstructures and dopant distribution in the WSix films were observed by high resolution Transmission Electron Microscopy (TEM).

Figure 4:
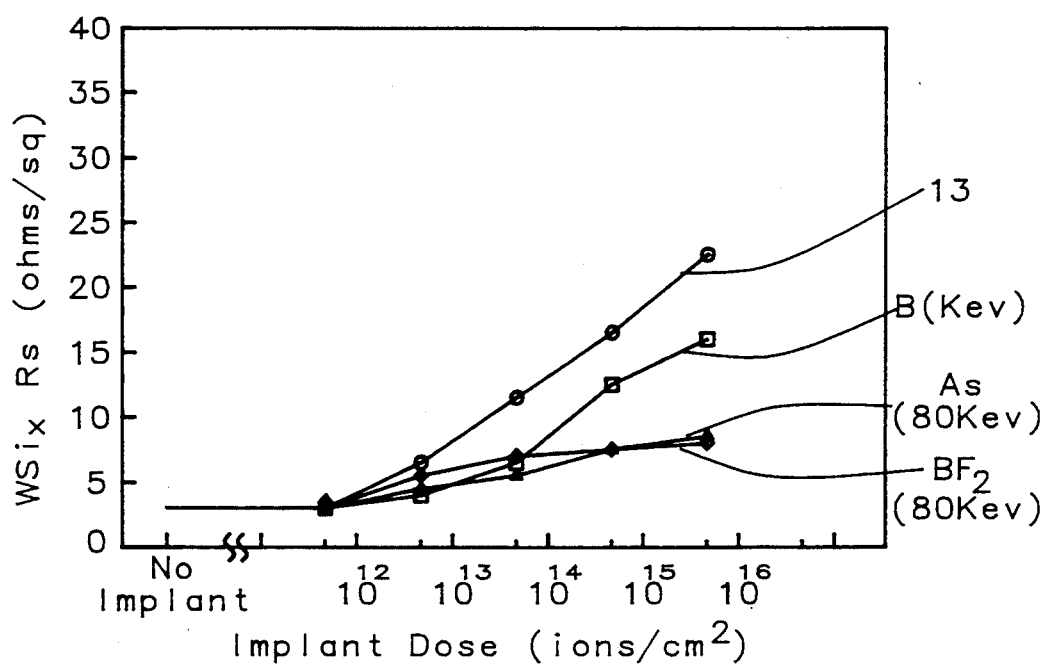
FIGS. 4–10 show a series of curves relating sheet resistance to implanted ion dose for several dopants, film thicknesses, and ion energies.
Figure 5:
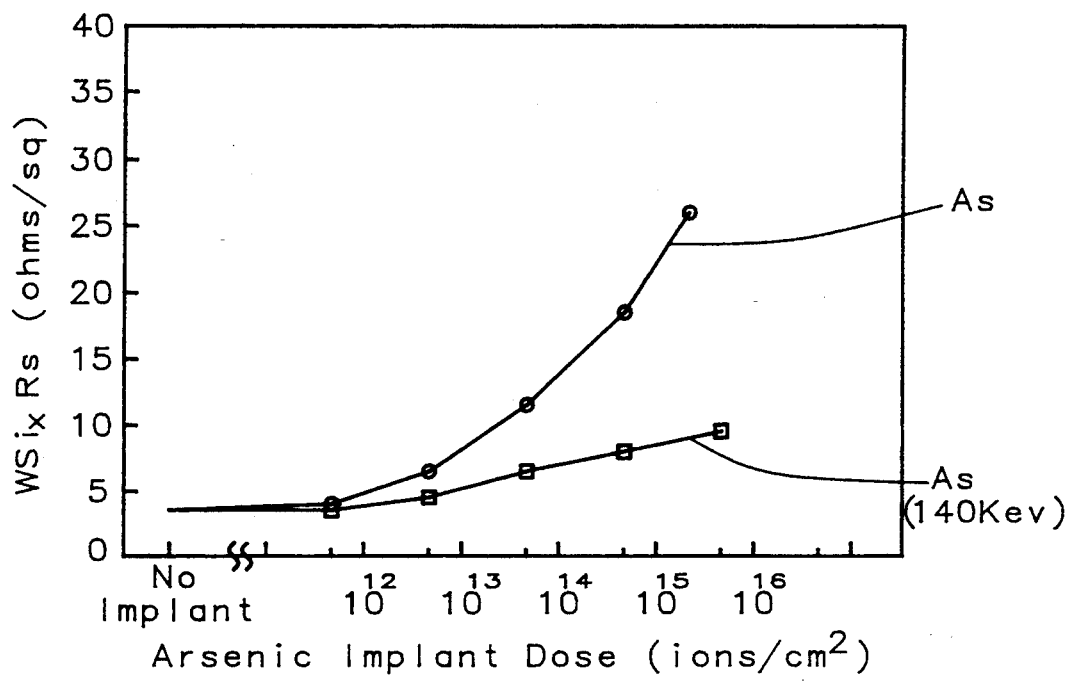
Figure 6:
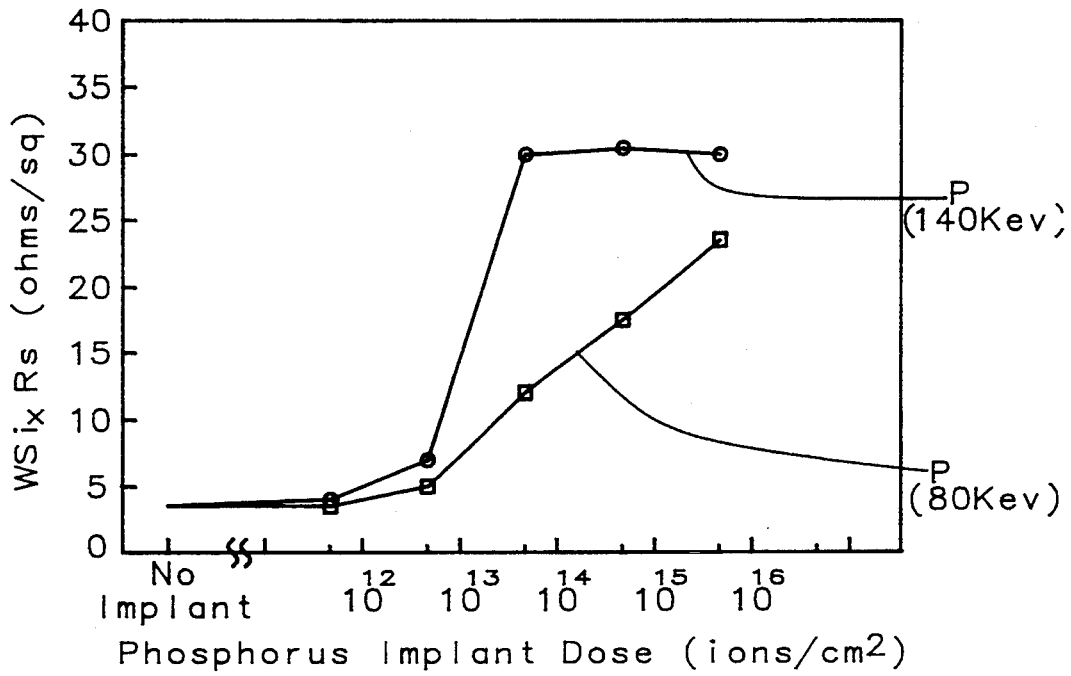
Figure 7:
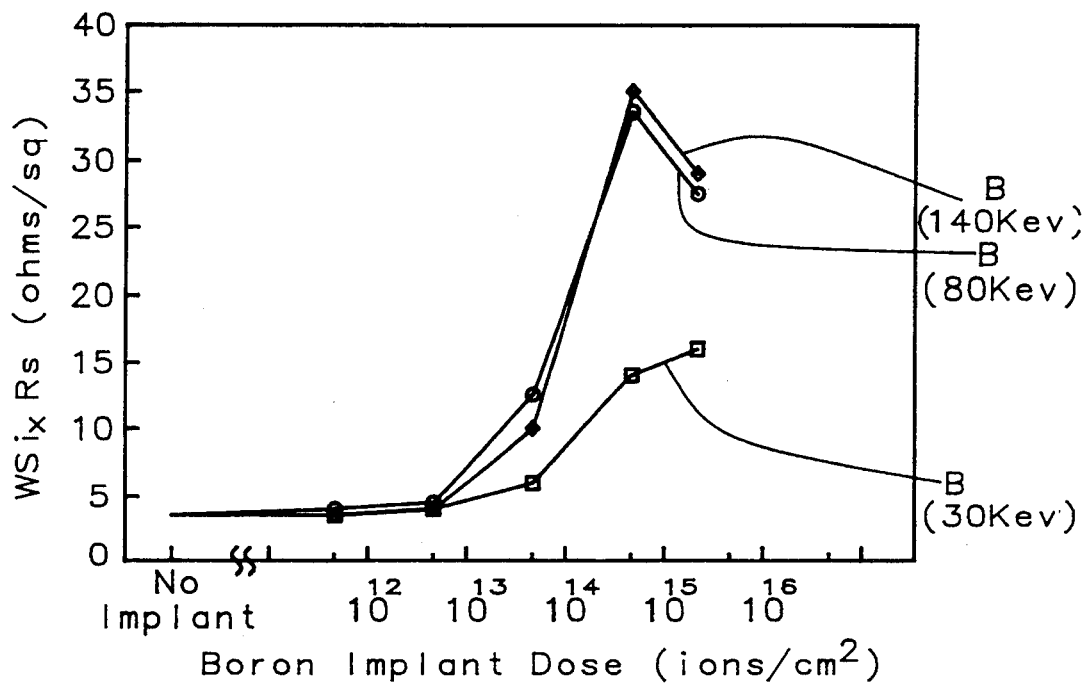
Figure 8:
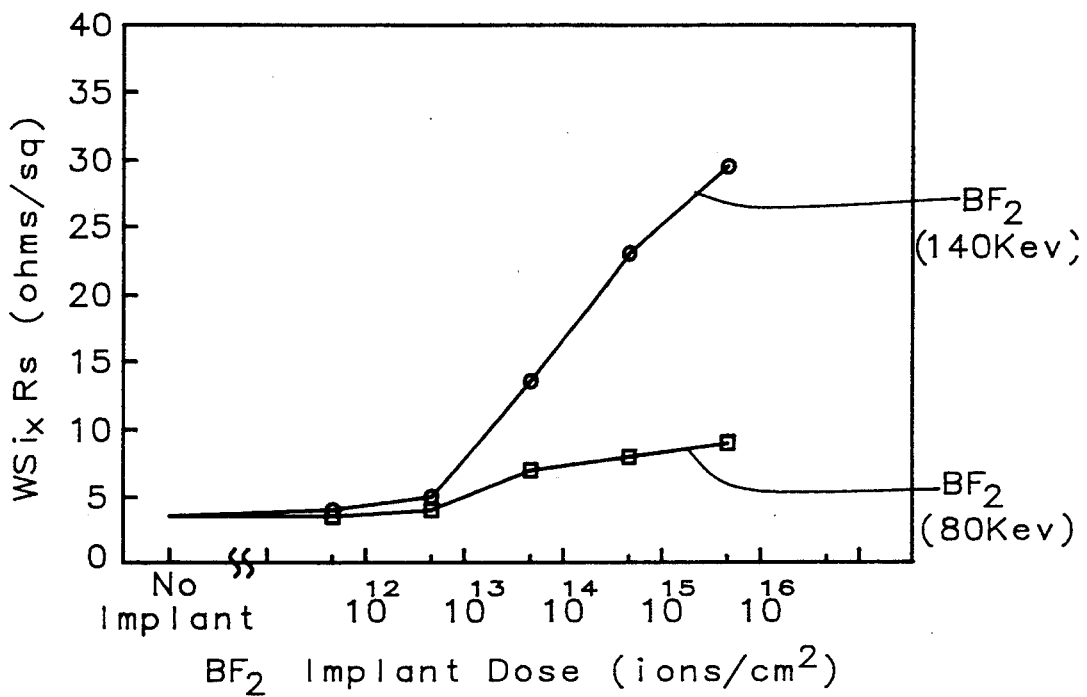

FIG. 4 summarizes the results of the sheet resistance of 2000 Angstrom films as a function of implant dosages. The resistance increases as implanted dose increases for As+, P+, B+, and BF2+. The unimplanted WSix has the lowest sheet resistance which serves as a reference. In FIG. 4, the WSix film 13 implanted with P+ ions shows the greatest slope which means that the P+ ion is the most sensitive dopant for implant monitoring using the measurement of WSix resistance. The characterization of the influential factors on WSix resistance, such as doping species, ion implantation energies, WSix film thicknesses, and annealing temperatures will be discussed.

Figure 9:
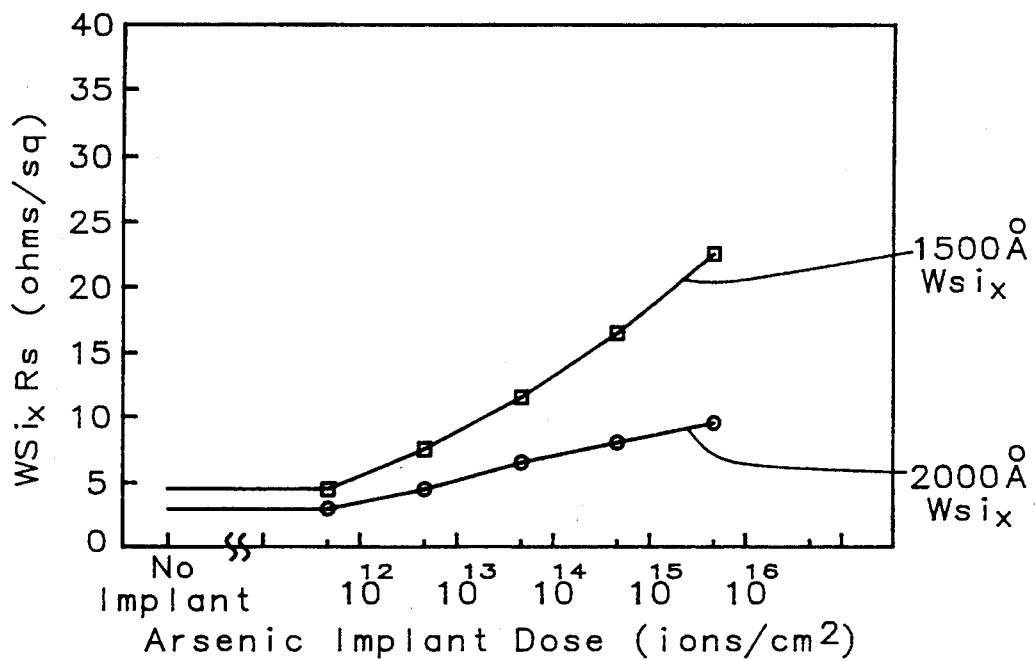
Figure 10:
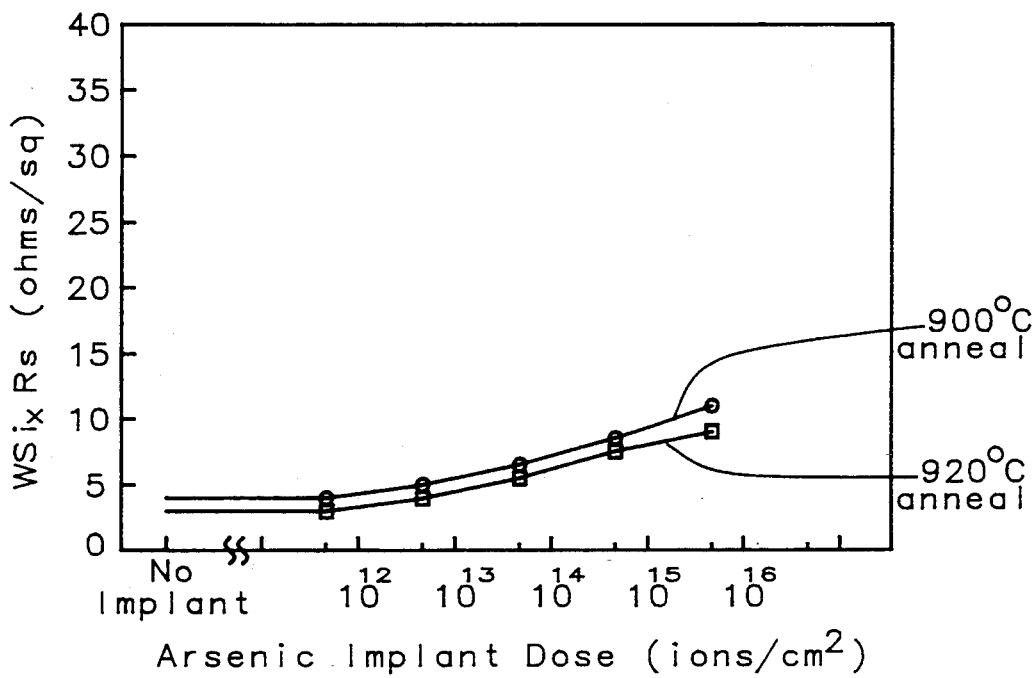

FIGS. 5, 6, 7, and 8 show the resistance of 2000 Angstrom WSix for the samples implanted with As+, P+, B+, and BF2+ at different implantation energies, respectively. Generally, the slope of a curve increases as implant energy increases. However, for some samples, the slope levels off or decreases as the implant energy becomes too high and causes the dopants to penetrate through the WSix film. FIG. 9 illustrates the effect of WSix film thickness between 1500 Angstroms and 2000 Angstroms on resistance. Thinner WSix thicknesses show higher sensitivity in resistance change than thicker films. Only marginal differences are found between the WSix annealing temperatures of 900 deg. C. and 920 deg. C. as indicated in FIG. 10. The aforementioned results imply that the change of silicide resistance is dominated by ion implantation energy and film thickness. Once these factors have been taken into account a suitable thickness of silicide film may be selected for monitoring a particular ion species and energy range. For example, for 80 KeV phosphorus ions (see curve 13 in FIG. 4) an observed change in sheet resistance from 5 to 19 ohms/square would imply an implanted ion dosage of $10^{15}$ ions/cm$^2$.

Comparing the microstructures between the unimplanted and implanted samples, TEM images of samples were made (but not herein illustrated) where silicide films were annealed and then heavily implanted with various species. The cross-section TEN picture for the WSix film annealed at 900 deg. C. before ion implantation contains two grains thick in the film and the grain size varies from 700 to 1000 Angstroms. The TEM cross-sections for the implanted samples indicate that the silicide layers are split into two different contrast layers. In the distinct bilayer, the upper layer is the silicide with high dopant concentration that causes damage and dislocation loops in the WSix film. These impurities and defects will act as scattering centers for carriers. The lower contrast layer is silicide that has not been affected by ion implantation. A lightly implanted sample with P+ at $5\times10E13$ ions/cu. cm. has a shallower implanted layer than the sample with P+ at 5×10E15 ions/cu. cm. It proves that less damage is found in a lightly implanted sample than a heavily implanted one.

Correlating between electrical and microstructural film properties, the agreement between the increased resistance and the implanted layer thickness in TEM pictures is very good. With a thicker implanted layer in the silicide films the resistance of the silicide film will increase.

In the new technique, all control wafers can be saved at the ion implantation stage. As a result, the cycle time of off-line implant monitoring by this new technique is only about half an hour, close to the time of the thermal wave technique and much less time than the implanted silicon wafer technique. Another advantage of the new off-line technique is that it is economical due to the fact that dozens of control wafers can be produced in one batch.

Real-time implant monitoring is very important in a high volume VLSI Integrated Circuit line. We apply the fact that the resistance of metal films, such as refractory metal silicide films, significantly increases with implant dosage to an implant monitor for both real-time and off-line cases. The conditions of higher implant energy, and thinner metal films, such as tungsten silicide (WSix), show better sensitivity in terms of metal silicide resistance change unless the implanted depth is beyond the metal silicide thickness. Five to ten times the increase of resistance for the just implanted metal silicide films can be easily distinguished.

While the invention has been particularly shown and described with reference to the preferred embodiments thereof, it will be understood by those skilled in the art that various changes in form and details may be made without departing from the spirit and scope of the invention.

What is claimed is:

1. A method for monitoring ion implant dosage into a semiconductor body comprising:
   providing a metal layer having a known sheet resistance adjacent to, and in the same chamber as, said semiconductor body;
   simultaneously ion implanting a dopant into said semiconductor body and said metal layer, wherein said metal layer is damaged by said ion implanting which results in a change of sheet resistance;
   and determining the implanted ion dosage in said semiconductor body by monitoring the change in sheet resistance of said metal layer.

2. The method of claim 1 wherein said metal layer is a metal silicide.

3. The method of claim 2 wherein said metal silicide is titanium silicide.

4. The method of claim 2 wherein said metal silicide is cobalt silicide.

5. The method of claim 2 wherein said metal silicide is tungsten silicide.

6. The method of claim 2 wherein said metal silicide layer has a thickness between 1,000 and 2,500 Angstrom Units.

7. A method for monitoring ion implant dosage into a semiconductor body comprising:
   providing a metal layer having a known sheet resistance on said semi conductor body;
   simultaneously ion implanting a dopant into said semiconductor body and said metal layer, wherein said metal layer is damaged by said ion implanting which results in a change of sheet resistance;
   and determining the implanted ion dosage in said semiconductor body by monitoring the change in sheet resistance of said metal layer.

8. The method of claim 7 wherein said metal layer is a metal silicide.

9. The method of claim 8 wherein said metal silicide is titanium silicide.

10. The method of claim 8 wherein said metal silicide is cobalt silicide.

11. The method of claim 8 wherein said metal silicide is tungsten silicide.

12. The method of claim 8 wherein said metal silicide layer has a thickness between 1,000 and 2,500 Angstrom Units.

13. A method for monitoring ion implant dosage into a semiconductor body comprising:
   providing a refractory metal silicide layer having a known sheet resistance on said semiconductor body;
   simultaneously ion implanting a dopant into said semiconductor body and said refractory metal silicide layer, wherein said refractory metal silicide layer is damaged by said ion implanting which results in a change of sheet resistance;
   and determining the implanted ion dosage in said semiconductor body by monitoring the change in sheet resistance of said refractory metal silicide layer, wherein said implanted ion dosage is in the range $1 \times 10E13$ ions/sq. cm. to $1 \times 10E16$ ions/sq. cm.

14. The method of claim 13 wherein said refractory metal silicide layer is tungsten silicide.

15. The method of claim 13 wherein said refractory metal silicide layer is titanium silicide.

16. The method of claim 13 wherein said refractory metal silicide layer is cobalt silicide.

17. The method of claim 13 wherein said metal silicide layer has a thickness between 1,000 and 2,500 Angstrom Units.

18. A method for monitoring ion implant dosage into a semiconductor body including alignment marks, comprising:
   providing a metal layer having a known sheet resistance on said semi conductor body;
   using two of the alignment marks on said semi conductor body for the location of said metal layer wherein one alignment mark is used for N− and N+ ion implants and the other alignment mark is used for P− and P+ implants;
   simultaneously ion implanting a dopant into said semiconductor body and said metal layer, wherein said metal layer is damaged by said ion implanting which results in a change of sheet resistance;
   and determining the implanted ion dosage in said semiconductor body by monitoring the change in sheet resistance of said metal layer.

19. The method of claim 18 wherein said metal layer is a metal silicide.

20. The method of claim 19 wherein said metal silicide is titanium silicide.

21. The method of claim 19 wherein said metal silicide is cobalt silicide.

22. The method of claim 19 wherein said metal silicide is tungsten silicide.

23. The method of claim 19 wherein said metal silicide layer has a thickness between 1,000 and 2,500 Angstrom Units.

24. The method of claim 19 wherein the N−,N+ region of the monitor is covered with photoresist during P−,P+ implantation and the P−,P+ region of the monitor is covered with photoresist during N−,N+ implantation.

25. A method for monitoring ion implant dosage into a semiconductor body including scribe lines, comprising:
providing a metal layer having a known sheet resistance on said semi conductor body;
using sections of the scribe lines on said semiconductor body for the location of said metal layer wherein one section of a scribe line is used for N− and N+ ion implants and the other section of a scribe line is used for P− and P+ implants;
simultaneously ion implanting a dopant into said semiconductor body and said metal layer, wherein said metal layer is damaged by said ion implanting which results in a change of sheet resistance;
and determining the implanted ion dosage in said semiconductor body by monitoring the change in sheet resistance of said metal layer.

26. The method of claim 25 wherein said metal layer is a metal silicide.

27. The method of claim 26 wherein said metal silicide is titanium silicide.

28. The method of claim 26 wherein said metal silicide is cobalt silicide.

29. The method of claim 26 wherein said metal silicide is tungsten silicide.

30. The method of claim 26 wherein said metal silicide layer has a thickness between 1,000 and 2,500 Angstrom Units.

31. The method of claim 26 wherein the N−,N+ region of the monitor is covered with photoresist during P−,P+ implantation and the P−,P+ region of the monitor is covered with photoresist during N−,N+ implantation.

* * * * *